INVENTOR,
EDWARD JAKUBOWICS
BY Harry M. Saragovitz
ATTORNEY.

INVENTOR,
EDWARD JAKUBOWICS
BY Harry M. Saragovitz
ATTORNEY.

2,964,714

AUTOMATIC FREQUENCY CONTROL SYSTEM

Edward Jakubowics, Fairhaven, N.J., assignor to the United States of America as represented by the Secretary of the Army Filed Apr. 2, 1959, Ser. No. 803,809

4 Claims. (Cl. 331—2)

Figure 1:
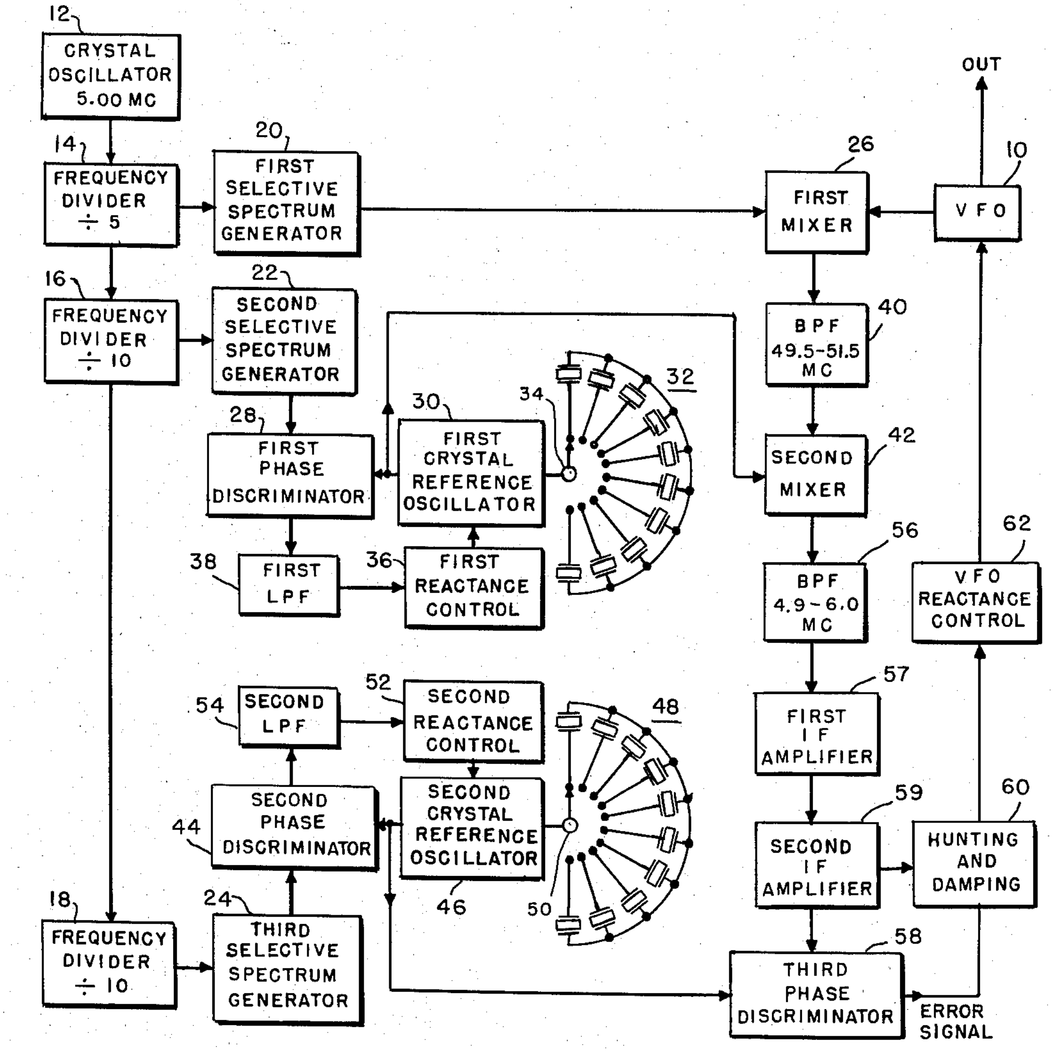

(Granted under Title 35, U.S. Code (1952), sec. 266)

The invention described herein may be manufactured and used by or for the Government for governmental purposes, without the payment of any royalty thereon.

This invention relates to multichannel frequency generators for generating oscillations of very high absolute stability which are adjustable in decade steps, for example, 1, 0.1 and .01 mcs. steps, respectively, the final frequency being derived from a final frequency oscillator which by means of automatic phase control (APC) is stabilized with respect to crystal controlled decade frequency generators. Such multichannel generators are of particular importance for use in single sideband, amplitude modulated, or narrow band frequency modulated HF, VHF, and UHF multichannel communication apparatus.

In a known arrangement of this kind, U.S. Patent No. 2,843,740, use is made of an auxiliary free-running oscillator, the frequency of which must also be tuned and controlled by means of an auxiliary oscillator control loop over a wide frequency range to provide the first and third decade of reference frequencies. In addition, two tunable filters and a tuned separation amplifier are required. A special pulse mixer tube is required when decade frequencies are derived from a single crystal.

It is an object of the invention to provide an improved multichannel generator without an auxiliary oscillator and without tuning except for selection of the crystals which are used in the second and third decade crystal oscillators.

It is a further object of the invention to provide an improved means for increased stability by deriving all decade frequencies from a single crystal and tuning to the proper decade frequencies solely by selection of crystal elements.

It is still a further object to attain these features without producing interfering signals in the final frequency oscillator so that all theoretically available channel frequencies can be used in practice.

In accordance with the present invention, the frequency control system for stabilizing a variable frequency oscillator includes a source of stable frequency which provides a plurality of stable reference frequencies that are related in harmonic fashion. Also included are discrete fixed-tuned spectrum generators connected to a respective one of the stable reference frequencies, each spectrum generator being adapted to simultaneously generate a plurality of harmonics over discrete decade ranges. In addition, there are included means for heterodyning the decade spectrum of one of the generators with a selected output of the variable frequency oscillator to produce a first IF frequency, and a first crystal controlled interpolation frequency oscillator adapted to be selectively tuned through the same range as that of a second frequency spectrum and having the same frequency spacing. Included further are means responsive to the combined outputs of the second spectrum generator and a selected first interpolation frequency whereby the selected first interpolation frequency is phase-locked to its corresponding spectrum frequency. Further included are a second crystal-controlled interpolation frequency oscillator adapted to be selectively tuned through the same range as that of a third frequency spectrum and having the same frequency spacing, and means responsive to the combined outputs of the third frequency spectrum and a selected second interpolation frequency whereby the selected second interpolation frequency is phase-locked to its corresponding spectrum frequency. In addition, there are included a second mixer for heterodyning the first IF frequency and the phase-locked first interpolation frequency to produce a second IF frequency which corresponds to the selected second interpolation frequency, and a phase discriminator means responsive to the second IF frequency and the phase-locked second interpolation frequency whereby there is produced an error voltage when the second IF frequency and the selected second interpolation frequency are not in phase-lock. The error voltage is applied to control the variable frequency oscillator until the last-mentioned phase-lock is achieved.

Figure 2:
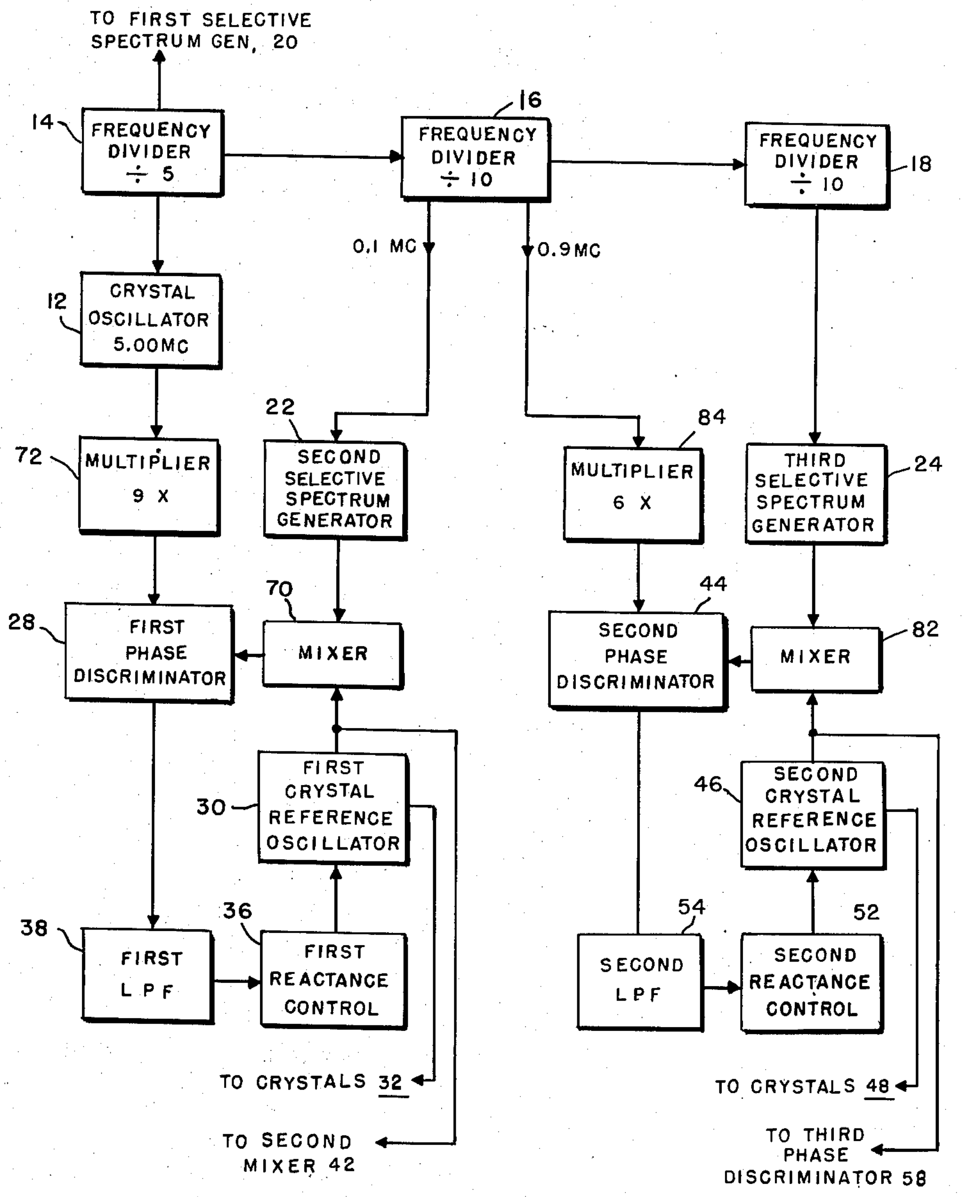

For a better understanding of the invention, together with other objects thereof, reference is had to the following description taken in connection with the accompanying drawings, in which:

Fig. 1 illustrates in block schematic form a preferred embodiment of the invention, and Fig. 2 illustrates an alternative arrangement for producing phase-locked interpolation frequencies.

In the description below, typical operating frequencies are illustrated to better understand the invention. It is to be understood, however, that the invention is not limited to such frequencies.

Referring now to Fig. 1, at 10 there is shown a variable frequency or free-running oscillator (VFO) adapted to provide a plurality of frequency channels having a minimum spacing of .01 megacycle over a prescribed range of frequencies. The output of oscillator 10 may be used as heterodyning oscillations in a superheterodyne receiver or as an exciter in a transmitter, and the operating frequency thereof is to be stabilized by the system of this invention. Variable oscillator 10 may be electrically tuned by a reactance tube, a saturable reactor, or a D.C. variable capacitor. Thus, the type of tuning for variable oscillator 10 is not important to this invention. Oscillator 10 is arranged to have an output frequency range of 40.00 mc. to 59.99 mc. with 10 kcs. channel spacing.

A single very accurate and stable source of reference frequency is provided. The unit which provides this reference frequency is a stabilized crystal controlled oscillator 12 which operates at a frequency of 5.00 mc. and is extremely stable. Oscillator 12 provides by means of a series of cascaded frequency dividers 14, 16, and 18, which may be the regenerative type, three stable frequencies which are applied as inputs to respective fixed-tuned spectrum generators 20, 22, and 24. The first frequency divider 14 divides the frequency of oscillator 12 by 5 to produce a stable frequency of 1 mc. which drives spectrum generator 20, which in turn generates a spectrum of harmonics of the 1 mc. input fed thereto. Spectrum generator 20 may be any of the conventional harmonic generators well known in the art. Spectrum generator 20 provides a first decade interpolation frequency ranging from 1 mc. to 10 mc., with 1 mc. spacing between adjacent harmonics. As shown, the output of spectrum generator 20 is applied as one input to No. 1 mixer 26 where it is heterodyned with the output of variable frequency oscillator 10, No. 1 mixer 26 having a selective output circuit fixed-tuned to be responsive only to a first prescribed intermediate frequency. The variable frequency oscillator range of 40.00–59.99 mc. is such that for one-half of its range, the first prescribed intermediate frequency is derived from the sum of the discrete output frequency from oscillator 10 and one of the simultaneously generated interpolation frequencies derived from spectrum generator 20, and for the other half of its range, the first intermediate frequency is derived from the difference between the output of oscillator 10 and one of the interpolation frequencies derived from spectrum generator 20. The output circuit of No. 1 mixer circuit 26 is tuned sufficiently broad to provide a minimum bandwidth of 2 mc. which is equal to the 1 mc. basic frequency input energizing spectrum generator 20 ± the 500 kc. maximum tolerable error in the output of VFO 10. With such an arrangement, the output circuit of No. 1 mixer 26 is fixed-tuned to a frequency of 50.5 mc. and, with a bandpass of substantially 2 mc. will provide a heterodyned signal output in the 49.5–51.5 mc. range.

The 1 mc. output of divider 14 is further divided by a factor of 10 in frequency divider 16 to produce a stable frequency of 0.10 megacycle and the 0.10 megacycle output from frequency divider 14 is still further divided by a factor of 10 in frequency divider 18 to produce a stable frequency of 0.01 mc. The 0.10 mc. output from frequency divider 16 energizes fixed-tuned spectrum generator 22 which in turn provides a decade frequency spectrum ranging from 44.6 to 45.5 mc. with 0.10 mc. spacing between adjacent harmonics. Such fixed-tuned selective spectrum generators are well known in the art and are fully described in Alwin Hahnel Patent No. 2,852,679, issued September 16, 1958. The output of spectrum generator 22 is applied as one input to first phase discriminator 28, the other input to phase discriminator 28 being derived from a first reference oscillator 30 which is adapted to provide ten selective discrete crystal-controlled uniformly spaced frequencies, hereinafter referred to as the second decade interpolation frequencies. The input circuit of phase discriminator 28 is fixed-tuned to 45.0 mc. and the output has a bandpass of 5 kc. As shown, each of the second interpolation frequencies is controlled by one of ten crystals shown at 32 and selected for operation through switch 34. The crystals are chosen to provide the same frequency range as that derived from spectrum generator 22 and with the same frequency spacing. Thus, ten interpolation frequencies ranging from 44.6 to 45.5 mc. in 0.10 mc. increments may be selectively applied from oscillator 30 to phase discriminator 28. As is well known, a beat direct voltage is produced in the output of phase discriminator 28 which voltage can be used to phase-lock one of the decade spectrum frequencies from spectrum generator 22 to its corresponding interpolation frequency derived from crystal oscillator 30. This is accomplished by means of a phase-lock control loop, hereinafter referred to as phase control loop No. 1, which includes a reactance control circuit 36 energized by the output of phase discriminator 28 through low-pass filter circuit 38, 5 kc. for example, and having its output applied to a frequency control element (not shown) associated with oscillator 30. With such an arrangement, a selected second interpolation frequency is stabilized at the desired crystal-controlled frequency and thus overcomes any variation in the frequency output of oscillator 30 due to drift or tolerance of the crystal chosen.

The 49.5–51.5 mc. difference frequency output of No. 1 mixer 26 is passed through a 49.5–51.5 mc. bandpass filter 40 to provide one of the inputs to No. 2 mixer 42, the other input to this mixer being provided by one of the selected second interpolation frequencies derived from reference oscillator 30. The output circuit of mixer 42 is selectively fixed-tuned to a frequency 5.45 mc. and is adapted to be tuned sufficiently broad to provide a minimum bandwidth of 1.1 mc. (4.9–6.0 mc.) so that any difference frequency between 5.40 and 5.49 mc. plus the maximum tolerable ±500 kc. error from VFO 10 will pass through mixer 42.

The stabilized 0.010 mc. output frequency from divider 18 energizes fixed-tuned harmonic spectrum generator 24 which is identical in structure and operation to spectrum generator 22. The output circuit of spectrum generator 24, however, is fixed-tuned to provide a decade spectrum ranging from 5.40 to 5.49 mc., and harmonically related to the input .010 mc. signal. The adjacent harmonics, of course, are spaced 0.010 mc. apart. As shown, the output of spectrum generator 24 is applied as one input to second phase discriminator 44, the other input to the phase discriminator 44 being derived from a second crystal reference oscillator 46 which is adapted to provide ten selective discrete crystal-controlled, uniformly spaced frequencies, hereinafter referred to as the third decade interpolation frequencies. Each of the third interpolation frequencies is controlled by one of ten crystals shown at 48 and selected for operation through switch 50. The crystals are chosen to provide the same frequency range as that derived from harmonic spectrum generator 24 and with the same frequency spacing as that of the above-mentioned decade spectrum from generator 24. Thus, ten third interpolation frequencies ranging from 5.40–5.49 mc. in 0.01 mc. increments may be selectively applied from oscillator 46 to phase discriminator 44. As is well known, a beat direct voltage is produced in the output of phase discriminator 44, which voltage can be used to phase-lock one of the decade spectrum frequencies from spectrum generator 24 to its corresponding third interpolation frequency derived from crystal oscillator 46. This is accomplished by means of a phase-lock control loop No. 2 which includes reactance control circuit 52 energized by the output of phase discriminator 44 through low-pass filter 54, 0.5 kc. for example, and having its output applied to the frequency control element (not shown) associated with second reference oscillator 46. By such an arrangement, a selected third interpolation frequency is stabilized at the desired frequency derived from one of the decade crystals 48 and thus overcomes any variation in the output of reference oscillator 46 due to drift or tolerance of the crystal chosen.

The 5.4–5.49 difference frequency output from No. 2 mixer 42 is passed through a 1.1 mc. bandpass filter 56, peaked at 5.45 megacycles, and a series of cascaded IF amplifiers 57 and 59 to provide one of the inputs to a third phase discriminator 58, the other input to phase discriminator 58 being provided by one of the selected third interpolation frequencies derived from second reference oscillator 46. The input circuit of phase discriminator 58 is fixed-tuned at 5.45 mc. and is sufficiently broad to pass the 100 kc. representing the total spacing between 5.4 and 5.49 mc. derived from crystals 48. The output of phase discriminator 58 provides an error signal voltage when the output of No. 2 mixer 42 differs from that of the selected third interpolation frequency. This error voltage is combined with that of a hunting and damping circuit 60 which is actuated by the output of cascade amplifier 59 to provide a control signal which is applied to VFO 10 through reactance control circuit 62. The hunting circuit 60 is used to extend the pulling range of the unsynchronized VFO 10 by causing it to search for the desired stabilized frequency. One such hunting circuit is described in Arthur R. Sills application Serial No. 664,447, filed June 7, 1957. Thus, the output of reactance control circuit 62 varies the frequency of VFO 10 until the output of No. 2 mixer 42 is equal to the frequency of the selected third interpolation frequency to produce a phase-lock therebetween.

In discussing the operation of the invention, let it be assumed that it is desired to stabilize free-running oscillator 10 at 55.25 mc. but it has drifted to 55.252 mc. Under these conditions, the 55.252 mc. output will heterodyne in No. 1 mixer 26 with the 5 mc. output from selective spectrum generator 20 to produce a first IF frequency of 50.252 mc. This first IF frequency is heterodyned in No. 2 mixer 42 with a second interpolation frequency of 44.8 mc. from reference oscillator 30 to provide a second IF frequency of 5.452 megacycles. The crystal reference oscillator 30 is stabilized at 44.8 mc. by means of phase control loop No. 1 as hereinabove described. The 5.452 mc. second IF frequency is compared in third phase discriminator 58 with a third interpolation frequency of 5.45 mc. which is derived from second reference oscillator 46 and which is stabilized by means of phase control loop No. 2 as hereinabove described. The output of third phase discriminator 58 will provide an error signal which is applied to VFO 10 in a manner such that when it is automatically tuned through 55.25 mc. by the action of the hunting circuit 60, the 5.45 mc. second interpolation frequency will phase-lock with a 5.45 mc. frequency derived from No. 2 mixer 42 and, as a result, a D.C. output will be derived from third phase discriminator 58 to maintain VFO 10 at the desired 55.25 mc. The output from No. 1 mixer 26 will now be 50.25 mc., which in turn is heterodyned with first interpolation frequency 44.8 mc. to provide the second IF frequency of 5.45 mc. Since this second IF frequency is equal to the second interpolation frequency of 5.45 mc., phase-lock is achieved to stabilize VFO 10 at the chosen frequency.

Fig. 2 illustrates another arrangement for deriving the phase-locked second and third interpolation frequencies. Referring now to Fig. 2, where like numerals refer to like components, two output frequencies 0.1 mc. and 0.9 mc. are derived from frequency divider 16. The 0.1 mc. frequency drives second spectrum generator 22 which in turn generates a narrow spectrum of selective harmonics of the 0.1 mc. input fed thereto. Spectrum generator 22 provides at least five harmonically related frequencies varying from 0.1 mc. to 0.5 mc. The spectrum output from frequency divider 16 is applied as one input to a mixer 70, the other input to mixer 70 being applied from first crystal reference oscillator 30. Mixer 70 is peaked at 45.0 mc. and the output therefrom is applied as one input to first phase discriminator 28, the other input to the discriminator 28 being a stable reference frequency of 45.0 mc. derived from stable oscillator 12 through multiplier 72. The output of first crystal reference oscillator 30 is stabilized by the output of first discriminator 28 through first low-pass filter 38 and first reactance control circuit 36 as hereinabove described. With this arrangement, each of the selected 44.6–45.5 crystal interpolation frequencies from reference oscillator 30 will beat with a respective one of the 0.1–0.5 mc. frequencies derived from spectrum generator 22 to produce an intermediate frequency of 45.0 kc. ± any error frequency. The output from first phase discriminator 28 will provide a correction signal such that the output from oscillator 30 will be tuned in a direction to provide the 45.0 mc. output from mixer 70 which will phase-lock with the 45.0 mc. stable reference frequency from multiplier 72. When phase-lock is achieved, a stabilized second interpolation frequency is provided. A third interpolation frequency is derived in the same manner. In this case the spectrum generator 24 output is arranged to provide at least nine harmonically related frequencies from .01 mc. to .09 mc., and the output of mixer 82 is peaked at 5.40 mc. and is applied as one input to second phase discriminator 44. The other input to second phase discriminator 44 is derived from the 0.9 mc. output from divider 16 through multiplier 84, the output of which provides a stable reference frequency of 5.40 mc. A third phase-locked interpolation frequency is provided when the IF frequency output of mixer 82 is exactly 5.4 mc.

While there has been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. In a frequency control system for stabilizing a variable frequency oscillator at a selected operating frequency; a source of stable frequency providing a plurality of stable reference frequencies that are related in harmonic fashion, discrete fixed-tuned spectrum generators connected to a respective one of said stable reference frequencies, each spectrum generator being adapted to simultaneously generate a plurality of harmonics over discrete decade ranges, means for heterodyning the decade spectrum output of one of said generators with the selected output of said variable frequency oscillator whereby there is produced a first IF frequency, a first crystal-controlled interpolation frequency oscillator adapted to be selectively tuned through the same decade range as that of a second of said spectrum generators and having the same frequency spacing, a first phase discriminator having two inputs and an output, the decade frequency output of said second spectrum generator being fed to one of said inputs and a selected first interpolation frequency being fed to the other of said inputs, means in circuit with the output of said phase discriminator and said first interpolation frequency oscillator whereby said selected first interpolation frequency is phase-locked to a corresponding frequency in the decade frequency output derived from said second spectrum generator, a second crystal-controlled interpolation frequency oscillator adapted to be selectively tuned through the same decade range as that of a third spectrum generator and having the same frequency spacing, a second phase discriminator having two inputs and one output, the decade frequency output of said third spectrum generator being fed to one of said inputs and a selected second interpolation frequency being fed to the other of said inputs, means in circuit with the output of said second phase discriminator and said second interpolation oscillator whereby said selected second interpolation frequency is phase-locked to a corresponding frequency in the decade frequency output derived from said third spectrum generator, means for heterodyning said first IF frequency and a selected phase-locked first interpolation frequency to produce a second IF frequency, and a third phase discriminator having two inputs and an output, a selected phase-locked second interpolation frequency being fed to one of said inputs and the second IF frequency being fed to the other of said inputs whereby there is produced an error signal in the output circuit of said third phase discriminator when said second IF frequency differs from said selected third phase-locked interpolation frequency, said error being fed to said variable frequency oscillator to control the output thereof.

2. In a frequency control system for stabilizing a variable oscillator at a selected operating frequency; a source of stable frequency providing first, second, and third stable reference frequencies which are related in harmonic fashion, first, second, and third spectrum generators respectively responsive to said first, second, and third stable reference frequencies whereby there are produced three discrete decade frequency spectrums, the frequencies in each decade spectrum being harmonically related, a first mixer for heterodyning the outputs of said variable frequency oscillator and the first of said decade frequency spectrums whereby there is produced a first IF frequency, a first crystal-controlled interpolation frequency oscillator adapted to be selectively tuned through the same range as that of the second spectrum generator and having the same frequency spacing, means responsive to the combined outputs of said second spectrum generator and a selected first interpolation frequency whereby said selected first interpolation frequency is phase-locked to its corresponding spectrum frequency, a second crystal-controlled interpolation frequency oscillator adapted to be selectively tuned through the same range as that of the third spectrum generator and having the same frequency spacing, means responsive to the combined outputs of said third spectrum generator and a selected second interpolation frequency whereby said selected second interpolation frequency is phase-locked to its corresponding spectrum frequency, a second mixer for heterodyning said first IF frequency and said phase-locked first interpolation frequency to produce a second IF frequency which corresponds to the selected second interpolation frequency, and phase discriminator means responsive to said second IF frequency and the phase-locked second interpolation frequency whereby there is produced an error voltage when the second IF frequency and the selected second interpolation frequency are not in phase-lock, said error voltage being applied to control said variable frequency oscillator until the last mentioned phase-lock occurs.

3. The system in accordance with claim 2 wherein said first decade spectrum frequencies are spaced 1 mc. apart, said second decade spectrum frequencies are spaced 0.1 mc. apart and said third decade spectrum frequencies are spaced 0.01 mc. apart.

4. In a frequency control system for stabilizing a variable frequency oscillator at a selected operating frequency; a source of stable frequency providing first, second, and third stable reference frequencies which are related in harmonic fashion, first, second, and third spectrum generators respectively responsive to said first, second, and third stable reference frequencies whereby there are producer three discrete decade frequency spectrums, the frequencies in each decade spectrum being harmonically related, the spacing between frequencies in said first, second, and third decade spectrums being 1 mc., 0.1 mc., and 0.01 mc., respectively, a first mixer for heterodyning the outputs of said variable frequency oscillator and the first of said decade frequency spectrums whereby there is produced a first IF frequency, a first crystal-controlled interpolation frequency oscillator adapted to be selectively tuned through the same range as that of the second spectrum generator and having the same frequency spacing, a first phase discriminator having two inputs and an output, the decade frequency output of said second spectrum generator being fed to one of said inputs and a selected first interpolation frequency being fed to the other of said inputs, means in circuit with the outputs of said phase discriminator and said first interpolation frequency oscillator whereby a selected first interpolation frequency is phase-locked to a corresponding frequency in the decade frequency output derived from said second spectrum generator, a second crystal-controlled interpolation frequency oscillator adapted to be selectively tuned through the same decade range as that of the third spectrum generator and having the same frequency spacing, a second phase discriminator having two inputs and one output, the decade frequency output of said third spectrum generator being fed to one of said inputs and a selected second interpolation frequency being fed to the other of said inputs, means in circuit with the output of said second phase discriminator and said second interpolation oscillator whereby said selected second interpolation frequency is phase-locked to a corresponding frequency in the decade frequency output derived from said third spectrum generator, a second mixer for heterodyning said first IF frequency and said phase-locked first interpolation frequency to produce a second IF frequency which corresponds to the selected second interpolation frequency, and phase discriminator means responsive to said second IF frequency and the selected second interpolation frequency whereby there is produced an error voltage when the second IF frequency and the second interpolation frequency are not in phase-lock, said error voltage being applied to control said variable frequency oscillator until the last mentioned phase-lock occurs.

References Cited in the file of this patent

UNITED STATES PATENTS 2,888,562 Robinson -------------- May 26, 1959